United States Patent
Hagiwara et al.

[11] Patent Number: 6,108,126
[45] Date of Patent: Aug. 22, 2000

[54] ILLUMINATING APPARATUS

[75] Inventors: Shigeru Hagiwara, Kawasaki; Hiroyuki Hiraiwa, Yokohama; Takashi Mori, Fujisawa, all of Japan

[73] Assignee: Nikon Corporation, Tokyo, Japan

[21] Appl. No.: 09/131,320

[22] Filed: Aug. 7, 1998

Related U.S. Application Data

[63] Continuation of application No. 08/842,514, Apr. 24, 1997, abandoned, which is a continuation of application No. 08/328,816, Oct. 25, 1994, abandoned.

[30] Foreign Application Priority Data

Oct. 26, 1993 [JP] Japan ................................ 5-267208

[51] Int. Cl.$^7$ ........................................................ F21V 9/06
[52] U.S. Cl. .................. 359/361; 359/358; 359/359; 313/112; 313/635; 355/71; 362/255; 362/293
[58] Field of Search .................................. 359/350, 359, 359/361, 358; 313/110, 112, 635, 636; 355/71; 362/255, 293, 263, 318

[56] References Cited

U.S. PATENT DOCUMENTS

| | | | |
|---|---|---|---|
| 4,907,029 | 3/1990 | Caprari | 355/67 |
| 5,109,181 | 4/1992 | Fischer et al. | 313/112 |
| 5,196,759 | 3/1993 | Parham et al. | 313/112 |
| 5,207,505 | 5/1993 | Naraki et al. | 362/373 |
| 5,214,345 | 5/1993 | Saito et al. | 313/112 |

OTHER PUBLICATIONS

Encyclopedia of Chemistry, vol. 9, P690, Kyoritsu Pub., 1964.
Chiba Univ. Environmental Sci. Res. Rep., vol. 1, No. 1, pp. 165–177.
Okabe, H., "Photochemistry of Small Molecules", P248, Wiley–Inter Science, 1978.
Hudson, R.D. et al, "Compilation of Atomic Ultraviolet Photoabsorption Cross Sections for Wavelengths Between 3000 and 10 Angstroms", Atomic Data 2, pp. 205, 235 and 253, 1971.

*Primary Examiner*—Darren E. Schuberg
*Attorney, Agent, or Firm*—Vorys, Sater, Seymour and Pease LLP

[57] ABSTRACT

An illuminating apparatus which comprises a light source, an optical system for condensing light emitted from the light source and illuminating an object with the condensed light, and an optical member which absorbs light having a wavelength from 260 to 340 nm among the light emitted from the light source, wherein the optical member is made of glass or crystalline material to which metal is doped.

28 Claims, 9 Drawing Sheets

ILLUMINATING APPARATUS

CROSS-REFERENCE TO RELATED APPLICATIONS

This is a continuation of application Ser. No. 08/842,514 filed Apr. 24, 1997, which is a continuation of application Ser. No. 08/328,816 filed Oct. 25, 1994, (both now abandoned).

BACKGROUND OF THE INVENTION

1. Field of the Invention

The present invention relates to an illuminating apparatus for illuminating an object with light emitted from a discharge lamp, such as a mercury lamp. The illuminating apparatus according to the present invention is preferably applied especially to an illuminating optical system in an exposure apparatus for manufacturing semiconductors.

2. Related Background Art

Illuminating apparatus for illuminating objects with light emitted from discharge lamps have been used for various purposes in various fields. For example, reduction-projection-type exposure apparatus (such as steppers, aligners, and so on), for manufacturing semiconductor elements such as LSIs and liquid crystal display elements according to the photo-lithography technique, use an illuminating apparatus which illuminates reticles on which transferring pattern is formed with light of a certain wavelength (i line having a wavelength of 365 nm, g line having a wavelength of 436 nm, and so on) emitted from extra-high pressure mercury lamps.

Much effort is being made in order to transfer a much finer pattern on a photosensitive substrate with higher resolution with such a reduce-projection-type exposure apparatus. In general, resolution R and depth of focus DOF of a projection-type exposure apparatus can be expressed as follows:

$$R = k_1 \cdot \lambda / NA \quad (1)$$

$$DOF = k_2 \cdot \lambda / NA^2 \quad (2)$$

wherein NA is the numerical aperture of the projection optical system, $\lambda$ is the wavelength of the exposure light, $k_1$ and $k_2$ are coefficients determined by processes employed. As is understood from these two formulas, finer pattern can be realized either (1) by increasing the numeral aperture NA of the projection optical system, or (2) by shortening the wavelength k (exposure wavelength) of exposure light.

With respect to the former technique (1), projection optical systems with a large numerical aperture from 0.5 to 0.6, which improves resolution, have been already realized. By only increasing the numerical aperture NA of the projection optical system, however, the depth of focus DOF must be reduced in inverse proportion to the square of the numerical aperture NA, as is understood from the formula (2). In typical semiconductor processes in practical use, a wafer which is to be subjected to exposure of a circuit pattern has irregularities on its surface formed in a previous process. Flatness of the wafer itself inevitably has errors. Accordingly, sufficient depth of focus DOF must be obtained.

With respect to the technique (2), the depth of focus DOF varies in proportion to the wavelength $\lambda$ of exposure light, as is clearly understood from the formula (2). Accordingly, it is more preferable to shorten the exposure wavelength $\lambda$ in order to improve resolution because sufficiently large depth of focus can be obtained. As a result, the emission line of a mercury lamp called i-line (having a wavelength of 365 nm) has almost replaced, as the exposure light used in the projection exposure apparatus, the emission line of the mercury lamp called g-line (having a wavelength of 436 nm).

FIG. 12 shows an example of the conventional illuminating apparatus used in a projection exposure apparatus, in which a mercury lamp is used as the light source, the emission point of the mercury lamp 1 is arranged at a first focal point F1 inside an ellipsoidal mirror 2. The inner surface of the ellipsoidal mirror 2 on which aluminum or plurality of layers of various dielectric materials are deposited serves as a reflecting surface. The light L emitted from the mercury lamp 1 is reflected by the inner surface of the ellipsoidal mirror 2 toward a mirror 3. On the reflecting surface of the mirror 3, also aluminum or plurality of layers of various dielectric materials are deposited. The light reflected by the mirror 3 is condensed at a second focal point F2 of the ellipsoidal mirror 2. Thus, a light source image is formed at the second focal point 2.

Light diverging from the second focal point F2 is substantially collimated by a collimator lens 4, and then is incident on a band-pass filter 5 of narrow-band type, which selects light having wavelength in a certain range as illuminating light. The illuminating light is incident on a fly's-eye lens 6, which forms a number of secondary light sources in its rear (reticle side) focal plane. Light beams diverging from these secondary light sources are reflected by a mirror 7 and condensed by a condenser lens 8. The pattern forming surface of a reticle 9 is illuminated superimposedly with a number of light beams condensed by the condenser lens 8. Note that aluminum or a plurality of layers of various dielectric materials are also deposited on the reflecting surface of the mirror 7.

As the optical path is bent by the mirrors 3 and 7, the size of the optical system is small. The inner surface of the ellipsoidal mirror 2 serving as a converging mirror and the reflecting surfaces of the mirrors 3 and 7 are designed to have maximum reflectance values with respect to the wavelength of the exposure light.

As the mercury lamp, an extra-high pressure mercury lamp is used. FIG. 13 shows the distribution of the emission spectrum of this extra-high pressure mercury lamp. FIG. 14A shows the relation between wavelengths and the reflectance of an aluminum reflecting mirror on which aluminum is deposited to form a reflecting surface. FIG. 14B shows the relation between wavelengths and the reflectance of a typical reflecting mirror according to the prior art on which a plurality of layers of dielectric materials are deposited to form a reflecting surface. Further, FIG. 15 shows the relation between wavelengths and the transmittance of the band-pass filter 5 when i line is the exposure light. In the above-mentioned construction, the pattern of the reticle 9 is illuminated with illuminating light (i line) with a uniform distribution of illuminance. And the image of the pattern is formed on the photosensitive substrate via the projection optical system (not shown in the drawing).

When the illuminating apparatus with the above-mentioned construction is used in the ambient atmosphere, white powder adheres to the surfaces of the optical members arranged between the mercury lamp 1 and the band-pass filter 5, that is, the surfaces of the ellipsoidal mirror 2, the mirror 3 and the collimator lens 4, including the entrance plane of the band-pass filter 5. Because of this white powder, the reflectance values and the transmittance of light L of these optical members decrease to reduce the illumination efficiency. Analysis shows that the white powder is ammonium sulfate, $(NH_4)_{2SO4}$ and that materials contributing to the formation of ammonium sulfate do not originally exist in the illuminating apparatus but come from the ambient atmosphere.

A method to solve the above problem is disclosed in U.S. Pat. No. 5,207,505. According to this method, said optical members are heated and maintained beyond 120° C. because ammonium sulfate decomposes beyond this temperature. ("Encyclopedia of Chemistry", Vol. 9, P690, Kyoritsu Pub., 1964) It is rather easy to heat up and maintain the ellipsoidal mirror 2 at such a high temperature because the mercury lamp 1 arranged near the ellipsoidal mirror 2 serves as an effective heat source. The other optical members, however, have to be heated by an additional, very effective heat source. As a semiconductor exposure apparatus requires especially strict temperature control, exhaust of heat is very difficult in practical use.

SUMMARY OF THE INVENTION

In consideration of the above-mentioned problems, the present invention was made. An object of the present invention is to provide an illuminating apparatus which condenses light emitted from a discharge lamp with a converging mirror and illuminates an object with the light led through optical members, wherein white powder of ammonium sulfate which adheres to the optical members can be reduced without newly adding an effective heat source or a mechanism for exhausting gaseous impurities.

With reference to FIG. 10, an illuminating apparatus according to the present invention comprises;

(a) a light source 1;

(b) an optical system consisting of optical members 2 to 8 for condensing light emitted from the light source 1 and illuminating an object 9 with said condensed light; and (c) an optical member 20 for absorbing light having a wavelength in a range from 260 to 340 nm among light emitted from the light source 1, wherein the optical member 20 is made of glass or crystalline material to which metal is doped.

Another illuminating apparatus, also with reference to FIG. 10, according to the present invention comprises:

(a) a light source 1;

(b) an optical system consisting of optical members 2 to 8 for condensing light emitted from the light source 1 and illuminating an object 9 with said condensed light; and (c) an optical member 20 containing a fluid for absorbing light having wavelength in a range from 260 to 340 nm among light emitted from the light source 1.

Still another illuminating apparatus according to the present invention, with reference to FIGS. 7 and 12, comprises;

(a) a lamp having a pair of electrodes 13A and 13B, the bulb (10, 22) of which shields light having wavelength in a range from 260 to 340 nm among light emitted from said pair of electrodes 13A and 13B; and (b) an optical system consisting of optical members 2 to 8 for condensing light emitted from the lamp and illuminating an object 9 with said condensed light.

Now basic principles of the present invention will be described. The inventors of the present invention carried out a further examination on the formation processes of white powder of ammonium sulfate from trace substances in the atmosphere.

Trace substances such as sulfur dioxide $SO_2$ (sulfurous acid) and ammonia $NH_3$ together with oxygen $O_2$ and water vapor $H_2O$ are common in the clean room in which the semiconductor exposure apparatus is used as well as in the air. It is probable that these substances react with one another with the help of ultraviolet rays having energy hν (h is Planck's constant, and ν is frequency) as follows.

(1) sulfer dioxide $SO_2$ is activated by energy of ultraviolet rays to be activated sulfur dioxide $SO_2^*$;

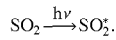

(2) The resultant activated sulfur dioxide $SO_2^*$ is oxidized to be sulfur trioxide $SO_3$;

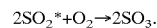

(3) The resultant sulfur trioxide $SO_3$ reacts with water $H_2O$ to be sulfuric acid,

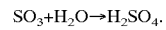

(4) On the other hand, ammonia $NH_3$ reacts with water $H_2O$ to be ammonium hydroxide;

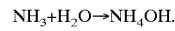

(5) The sulfuric acid from the process (3) is neutralized with the ammonium hydroxide from the process (4) to form ammonium sulfate;

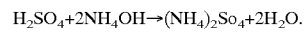

The above examination was carried out on the basis of "Chiba Univ. Environmental Sci. Res. Rep." Vol. 1, No. 1, pp 165–177.

The inventors of the present invention took notice of the reaction (1) among the above reactions in order to find a way to inhibit the formation of ammonium sulfate. According to H. Okabe: "Photochemistry of Small Molecules" P248, Wiley-Inter Science, 1978, sulfur dioxide has the following four absorption bands:

(1) 105–180 nm
(2) 180–240 nm
(3) 260–340 nm
(4) 340–390 nm

Since the ultra-high pressure mercury lamp emits little amount of light having a wavelength of 240 nm or shorter wavelengths, and at the same time since the white powder is found only in the optical path down to the entrance plane of the band-pass filter and not from the band-pass filter downward in the optical path, ultra-violet rays having a wavelength in a range from 260 nm to 340 nm are thought to be the main factor of the reaction. Accordingly, if ultraviolet rays having said wavelength from 260 nm to 340 nm can be shielded in the vicinity of the mercury lamp, adhesion of ammonium sulfate which hinders illumination efficiency can be reduced.

DESCRIPTION OF THE PREFERRED EMBODIMENTS

Now, the first embodiment according to the present invention will be described. This embodiment of the illuminating apparatus differs from the conventional illuminating apparatus in that the mercury lamp 1 is replaced by a new one having a double-bulb structure. First, this double-bulb mercury lamp used in this embodiment will be described.

Figure 1A:
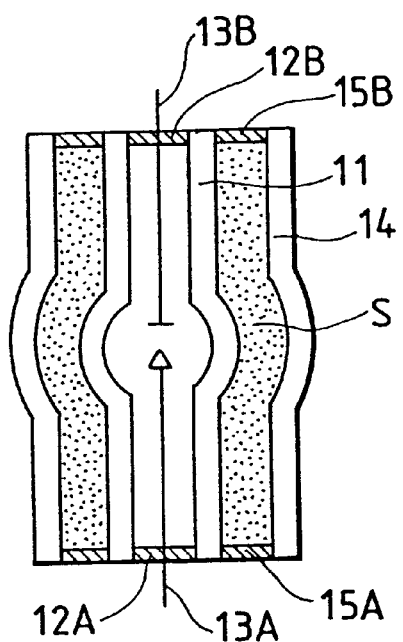
FIG. 1A is a cross-sectional view showing the structure of the mercury lamp used in a first embodiment of the illuminating apparatus according to the present invention.

FIG. 1A shows the mercury lamp used in this embodiment. A tubular inner bulb 11 has a spherical portion in the middle and the open ends are each sealed by respective bases 12A and 12B. Electrodes 13A and 13B are inserted through the bases 12A and 12B, respectively, into the hollow inside the inner bulb 11. Also substances necessary for emission of the mercury lamp are contained in the hollow inside the inner bulb 11. Thus, the inner bulb 11 with other necessary components functions as an ordinary ultra-high pressure mercury lamp. Further, a tubular outer bulb 14 also having a spherical portion in the middle surrounds the inner bulb 11. The doughnut-shaped openings at both ends of the outer bulb 14 are each sealed by respective bases 15A and 15B. A gas which absorbs light having a wavelength in a range from 260 to 340 nm is contained in a space S between the inner bulb 11 and the outer bulb 14.

Figure 13:
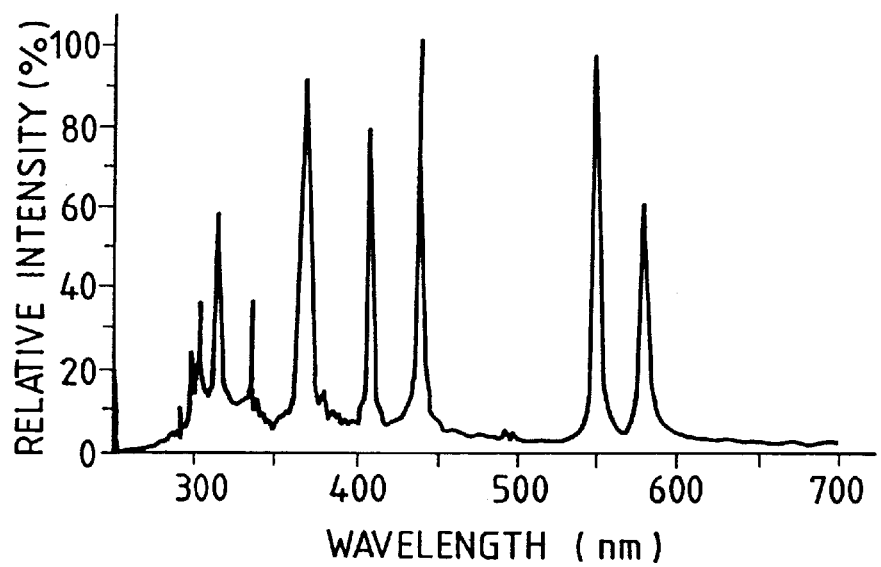
FIG. 13 is a chart showing the emission spectrum distribution of a ultra-high pressure mercury lamp.
Figure 14A:
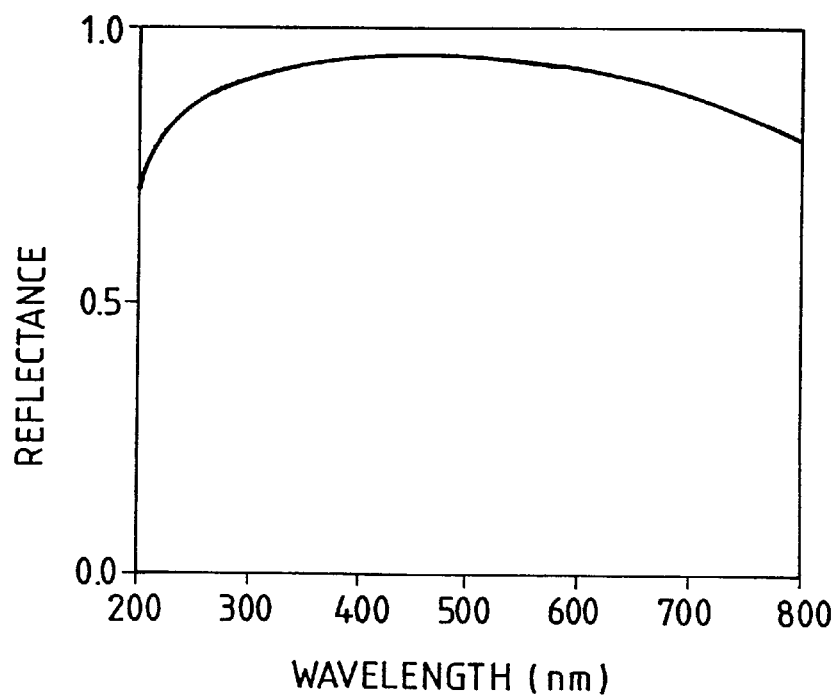
FIG. 14A is a chart showing the reflectance characteristics of a conventional aluminum reflecting mirror.
Figure 14B:
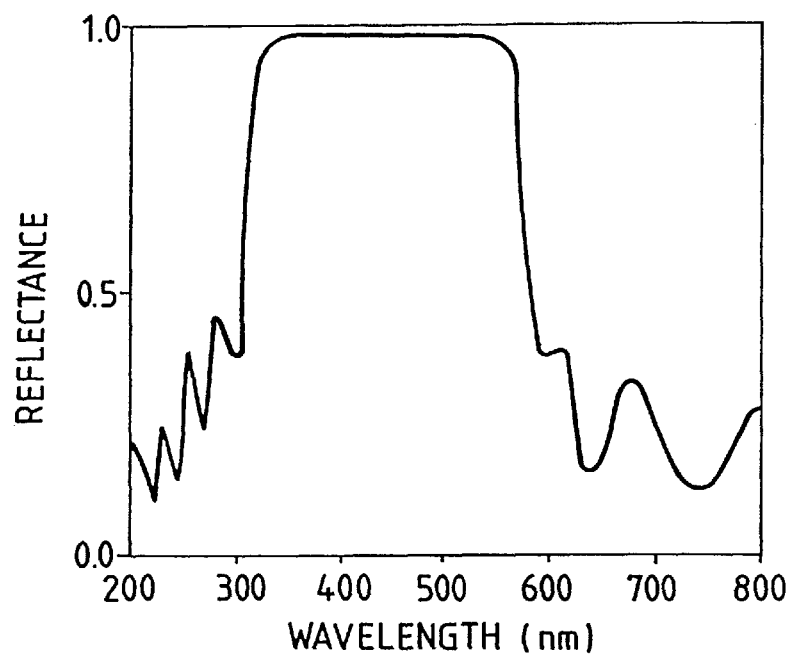
FIG. 14B is a chart showing the reflectance characteristics of a typical reflecting mirror coated with a multilayered film of dielectric substances.
Figure 15:
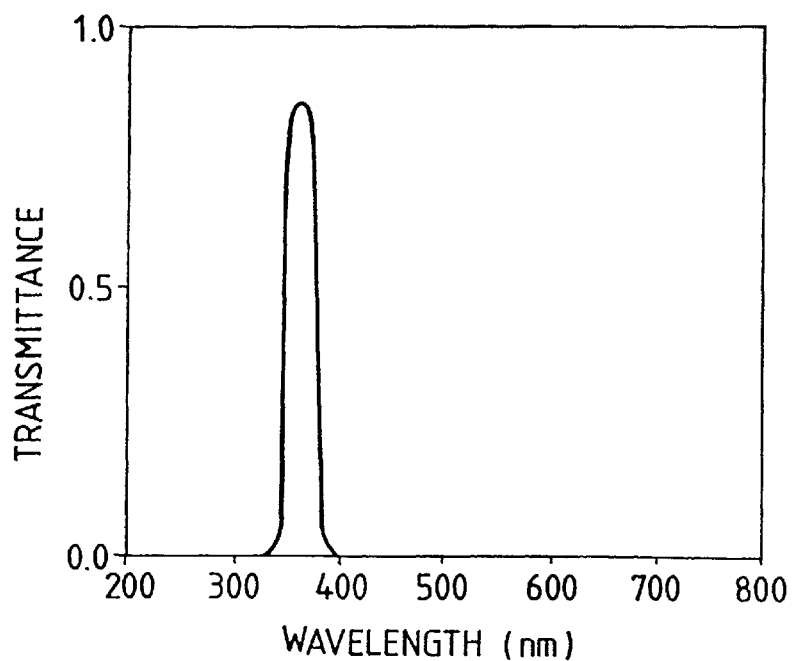
FIG. 15 is a chart showing the transmittance characteristics of a conventional band-pass filter.

As described before, the ultra-high pressure mercury lamp used in the projection exposure apparatus has the emission spectrum distribution shown in FIG. 13. As is clearly shown in FIG. 13, the ultra-high pressure mercury lamp has distributions in a wavelength range from 260 to 340 nm, that is, the wavelength range causing adhesion of the white powder (blurring phenomenon). In order to prevent emission of light in said wavelength range, the mercury lamp has the double-bulb structure and the gas which absorbs light having a wavelength in the range from 260 to 340 nm is contained in the space S between the inner bulb 11 and the outer bulb 14, as described above. Gases having such proper absorption characteristics include metallic vapour of rubidium, cesium, and the like.

Figure 2:
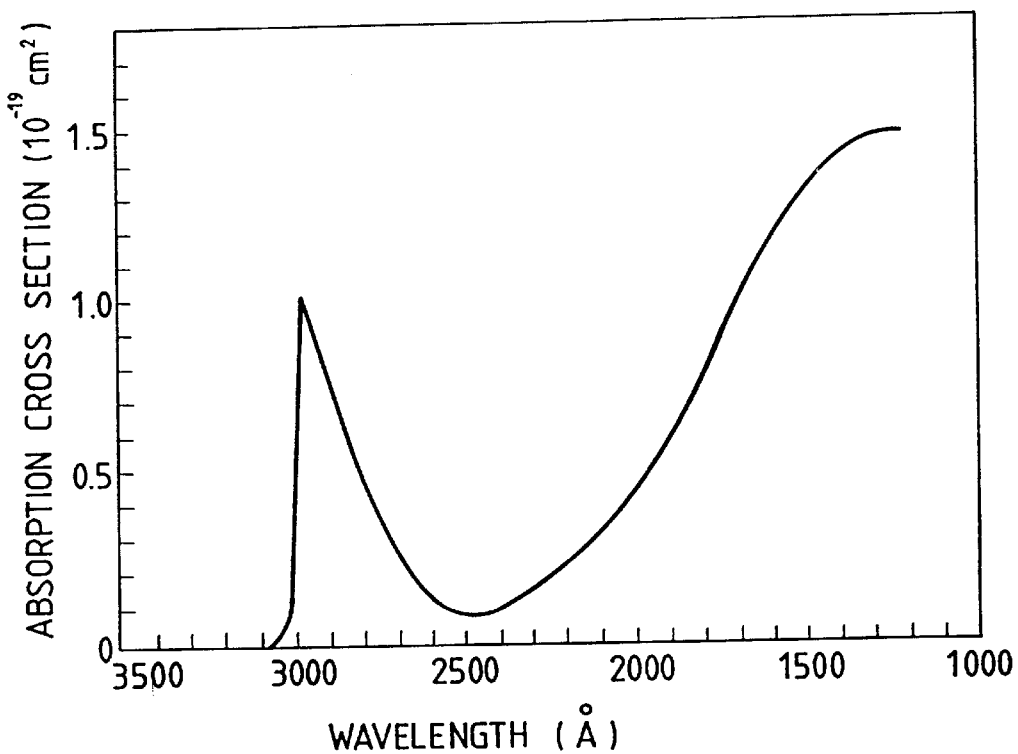
FIG. 2 is a chart showing the absorption cross section of vaporous rubidium (Rb).
Figure 3:
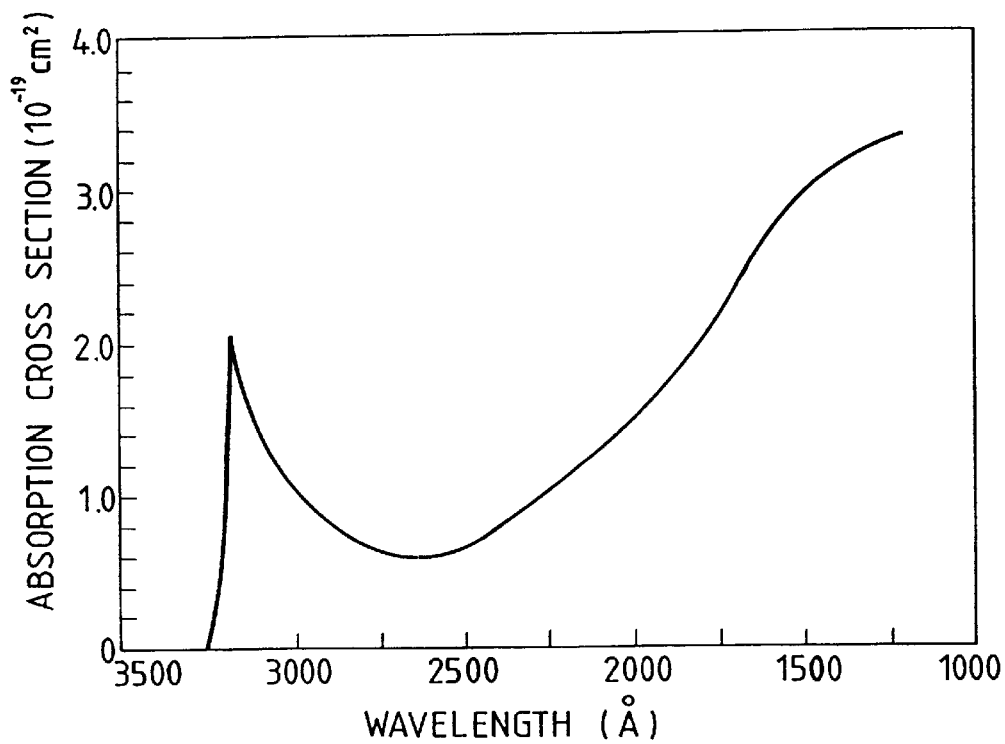
FIG. 3 is a chart showing the absorption cross section of vaporous cesium (Cs).

According to (R. D. Hudson and L. J. Kieffer, "Compilation of Atomic Ultraviolet Photoabsorption Cross Sections for Wavelengths Between 3000 and 10 Å", Atomic Data 2, pp 205–262 (1971), especially see p. 235 and p. 253, FIG. 2 shows the absorption cross section spectrum of vaporous rubidium. According to the same literature, FIG. 3 shows the absorption cross section spectrum of vaporous cesium. As is shown in FIGS. 2 and 3, both vaporous rubidium and vaporous cesium have large absorption cross sections for a wavelength of 340 nm and shorter wavelengths. Accordingly, if such metallic vapor is sealed in the space S of the double-bulb structure shown in FIGS. 1A and 1B, the light in said wavelength range causing the blurring phenomenon can be selectively removed from the light emitted from the inner bulb serving as an ultra-high pressure mercury lamp.

Figure 4:
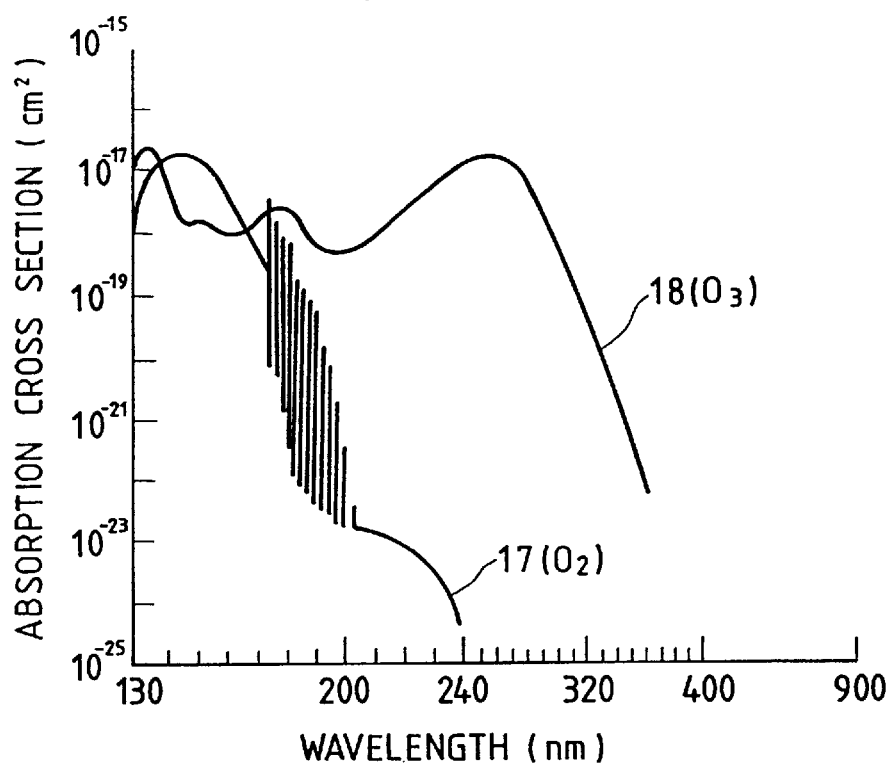
FIG. 4 is a chart showing the absorption cross section of ozone gas ($O_3$) and that of gaseous oxygen ($O_2$).

Gaseous ozone has absorption characteristics similar to those of the above metallic vapor. The absorption cross section spectrum of gaseous oxygen ($O_2$) and ozone gas ($O_3$) are shown in FIG. 4, in which reference numeral 17 indicates the absorption cross section spectrum of gaseous oxygen and reference numeral 18 indicates that of ozone gas. As is clearly shown is FIG. 4, the absorption spectrum of ozone gas ($O_3$) has ideal absorption characteristics for a wavelength of or shorter than 340 nm. The ozone gas, however, unlike metallic vapor, dissociates to be O and $O_2$ in photochemical reactions. Photochemical reactions of ozone and oxygen occur as shown in the following (in the following reaction formulas, M, which is called a third component, is any atom, molecule or ion except an oxygen atom, for example, a molecule of oxygen ($O_2$) or nitrogen ($N_2$)).

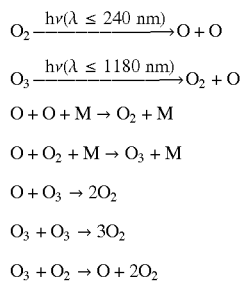

$$O_2 \xrightarrow{h\nu(\lambda \leq 240 \text{ nm})} O + O$$

$$O_3 \xrightarrow{h\nu(\lambda \leq 1180 \text{ nm})} O_2 + O$$

$$O + O + M \rightarrow O_2 + M$$

$$O + O_2 + M \rightarrow O_3 + M$$

$$O + O_3 \rightarrow 2O_2$$

$$O_3 + O_3 \rightarrow 3O_2$$

$$O_3 + O_2 \rightarrow O + 2O_2$$

Ozone $O_3$ and/or oxygen $O_2$ contained in the space S shown in FIG. 1A react as described above until the mixture of gases reaches a chemical equilibrium. The final density of ozone should be controlled in consideration of all the reactions and the final chemical equilibrium. In short, the final density of ozone after these photochemical reactions settles in a certain range regardless of any initial densities of ozone. The absorption efficiency for a wavelength of 340 nm and shorter wavelengths in the state of chemical equilibrium is obtained from the chart of FIG. 4 by calculating molecular densities of $O_3$ and $O_2$. A full detail of the calculation is not given here, but an outline thereof is as follows. For example, negligible reactions with respect to reaction energy and so on are put out of account. Molecular densities are approximately calculated from, for example, the following formula expressing the condition of chemical equilibrium:

$$\frac{dn}{dt} = 0 \tag{3}$$

wherein n is concentration of each substance. The dissociation rate J of $O_3$ or $O_2$ can be calculated as follows:

$$J = \int_0^{\lambda max} \frac{dN(\lambda)}{d\lambda} \sigma(\lambda) d\lambda \tag{4}$$

wherein J's dimension is [1/sec], $$\frac{dN(\lambda)}{d\lambda}$$

[$cm^{-1}$, $sec^{-1}$, $cm^{-1}$] is the number of photons passing per second per unit wavelength per unit area, $\sigma(\lambda)[cm^{-2}]$ is the photoelectric absorption cross section of a molecule, and $\lambda$max is the maximum wavelength of $\lambda$ in the above reactions.

The reaction rate of each reaction can be obtained from well-known literature. Light absorption efficiency can be promoted by increasing pressure of the gas contained in the double-bulb structure shown in FIG. 1A. But temperature increase caused by light absorption must be taken into account. That is, both the inner bulb 11 and the outer bulb 14 have to be made of glass material having a small coefficient of thermal expansion as well as enough strength.

Figure 1B:
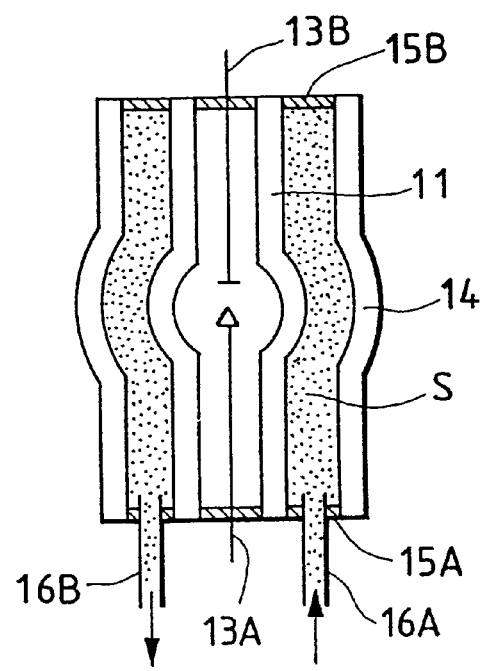
FIG. 1B is a cross-sectional view showing a modification of the mercury lamp shown in FIG. 1A.

The gas which absorbs light having a wavelength from 260 to 340 nm may be circulated through the space S between the inner bulb 11 and the outer bulb 14, as shown in FIG. 1B. In this case, the gas is supplied through a pipe 16A into the space S by a gas supplier (not shown), wherein conditions of the gas (density, pressure, flow velocity, temperature, and so on) must be well controlled. The gas is exhausted through another pipe 16B to an exhaust system (not shown). By circulating the gas through the double-bulb structure, high light absorption efficiency can be maintained.

When the structure shown in FIG. 1B is adopted, additional systems are required to monitor and control the pressure and the temperature of the gas circulated through the double-bulb structure. The systems for monitoring and controlling the pressure and the temperature of metallic vapor are very large. So metallic vapor is preferably contained in the double-bulb structure, as shown in FIG. 1A, when it is desirable to simplify the construction of the whole apparatus. In practice, ozone gas is usually circulated through the double-bulb structure shown in FIG. 1B. In this case, however, the density of ozone circulated through the double-bulb structure has to be newly calculated. If the time required to reach the equilibrium is much longer than the time during which the gas remains inside the double-bulb structure, the initial density of ozone has to be high. Otherwise, the flow velocity is changed to obtain desirable densities of ozone.

Next, the second embodiment according to the present invention will be described with reference to FIGS. 5 and 6. This embodiment has a construction similar to that shown in FIG. 12, wherein an impurity having certain absorption characteristics is doped in the bulb of the mercury lamp 1. First, the structure of the mercury lamp used in this embodiment will be described.

Figure 5:
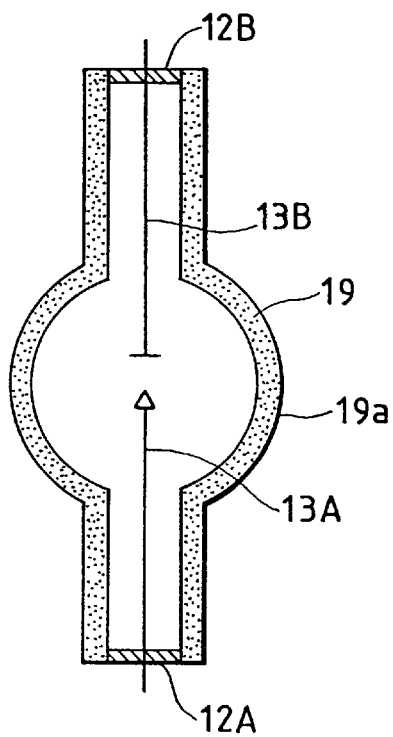
FIG. 5 is a cross-sectional view showing the structure of the mercury lamp used in a second embodiment of the illuminating apparatus according to the present invention.
Figure 6:
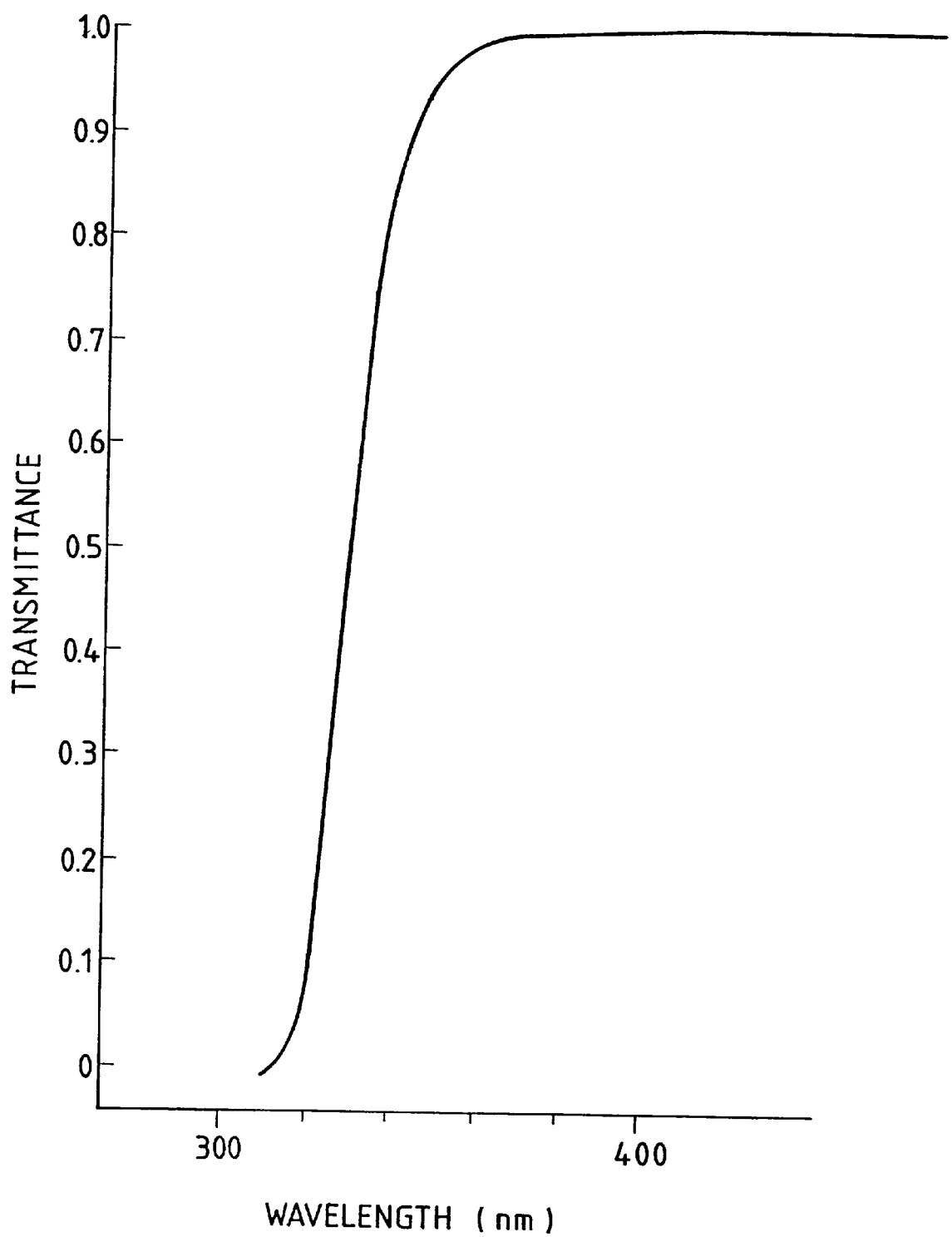
FIG. 6 is a chart showing transmittance characteristics of glass material LF5W.

FIG. 5 shows the mercury lamp of this embodiment. A tubular bulb 19 has a spherical portion in the middle. The openings of the bulb 19 are sealed by bases 12A and 12B. Electrodes 13A and 13B are inserted in the hollow inside the bulb 19 through the bases 12A and 12B, respectively. Thus the bulb 19 with other necessary components functions as an ordinary ultra-high pressure mercury lamp. An impurity which absorbs light having wavelength of 340 nm and shorter wavelengths is doped in quartz glass, of which the bulb 19 of the lamp 1 is made.

One of materials which are preferably doped in quartz glass is sodium Na. Sodium Na, however crystallizes $SiO_2$ at high temperatures, which blurs the bulb 19. Accordingly, the bulb 19 has to be kept at a temperature of 1000° C. or lower. Other preferable materials to be doped in quartz glass include iron Fe, lead Pb, aluminum Al, rubidium Rb, cesium Cs, and the like on.

The bulb 19 can be made of materials on the market. For example, ULETM titanium silicate glass (manufactured by Corning Co., Commodity No. 7971) can be used without doping an impurity. This ULETM titanium silicate glass absorbs light having a wavelength of 300 nm and shorter wavelengths, so the lamp can be effectively prevented from being blurred.

Also glass material LF5W manufactured by Ohara Co. is useful. This glass material LF5W exhibits light transmittance characteristics shown in FIG. 6. The transmittance of this material having a thickness of 10 mm for the light having a wavelength 365 nm (i line) is 0.994, from which reflection loss has already subtracted. This glass material having said characteristics can satisfy conditions required according to this embodiment. This glass material, however, causes solarization when used at low temperatures. In addition, it can not be used at 400° C. or higher temperatures. Accordingly, the bulb 19 has to be controlled in the temperature range from 100° C. to 400° C.

Now, the third embodiment of the present invention will be described with reference to FIGS. 7, 8 and 9.

Figure 12:
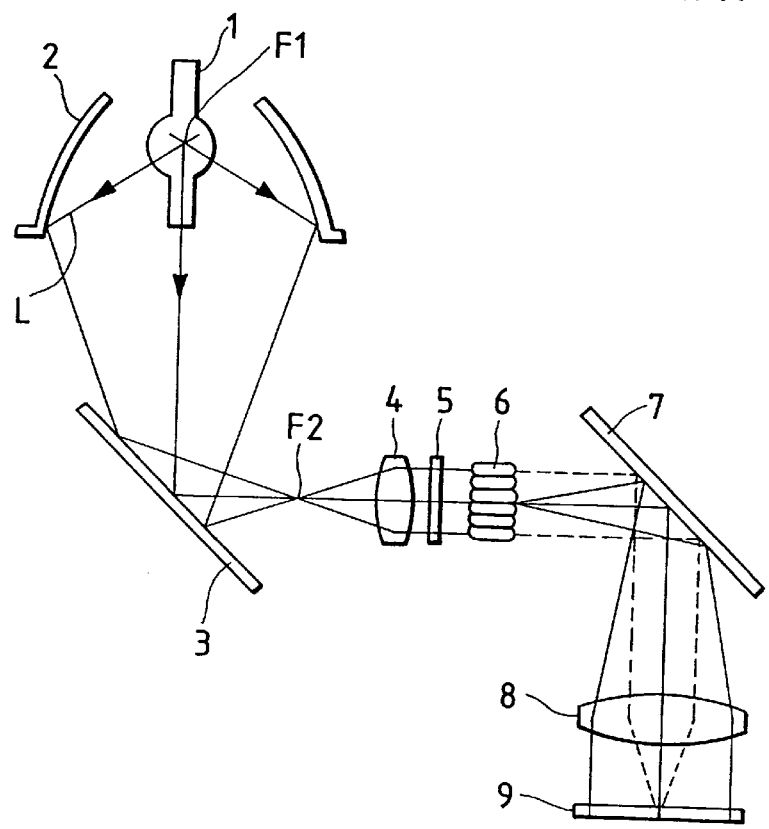
FIG. 12 is a schematic view showing the construction of a conventional illuminating apparatus.

This embodiment also has a construction similar to that shown in FIG. 12, wherein the glass of the mercury lamp 1 is coated with a multilayered film. The same members as those of the second embodiment are indicated by the same reference numerals and detailed description thereof is omitted. First, the structure of the mercury lamp used in this embodiment will be described.

Figure 7:
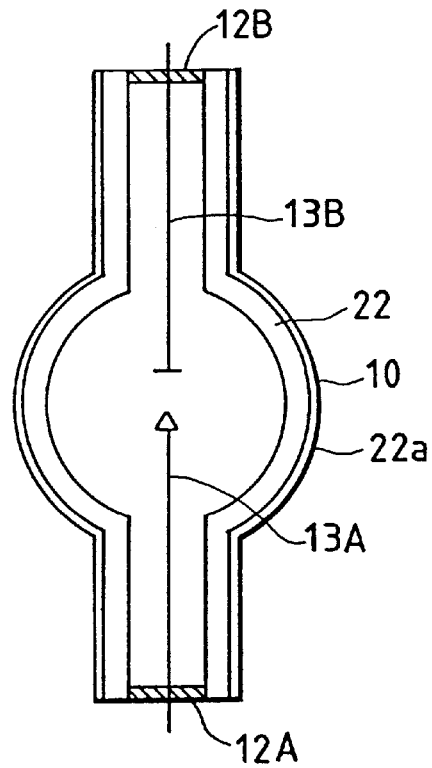
FIG. 7 is a cross-sectional view showing the structure of the mercury lamp used in a third embodiment of the illuminating apparatus according to the present invention.

The mercury lamp of this embodiment shown in FIG. 7 has a bulb 22 made of ordinary glass material. The outer surface 22a of the bulb 22 is coated with a multilayered film 10, which reflects light having a wavelengths in a range 260 to 340 nm and transmit light having wavelength of 350 nm or longer wavelengths. In other words, the multilayered film selectively transmits the light used as exposure light. An example of the multilayered film having selectivity with ct to wavelengths is designed as:

$$air \bigg/ \left(\frac{\lambda}{8}H : \frac{\lambda}{4}L : \frac{\lambda}{8}H\right)^n \bigg/ substrate \tag{5}$$

wherein: H is selected from a group including $ZrO_2$, $Sc_2O_3$, $HfO_2$, $Y_2O_3$, and the like; L is selected from a group including $SrO_2$, $MgF_2$, and the like; the wavelength $\lambda$ is determined to be about 300 nm; and the number of layers n is generally from 8 to 16.

Figure 8:
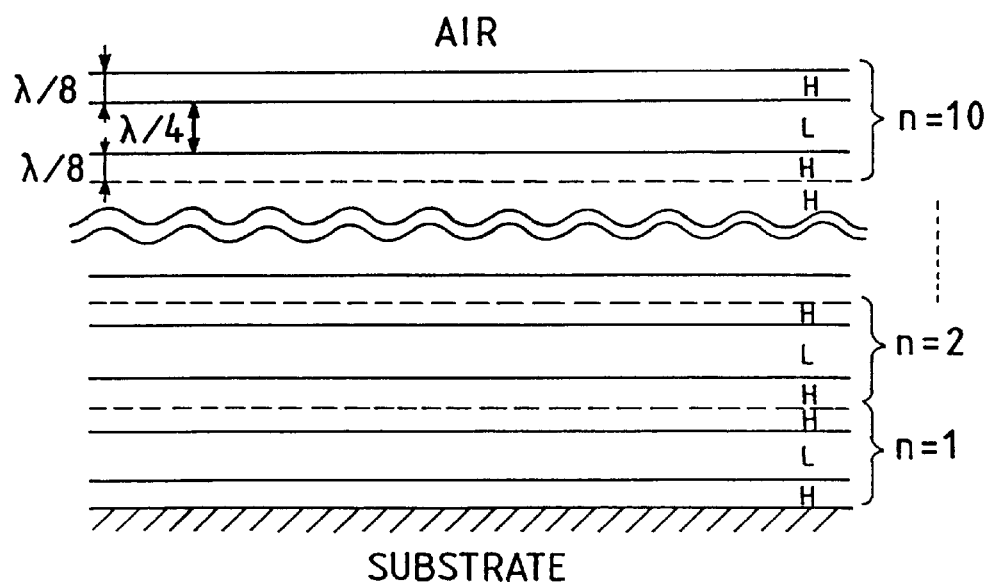
FIG. 8 is a cross-sectional view of the multilayered film with which the surface of the substrate is coated.
Figure 9:
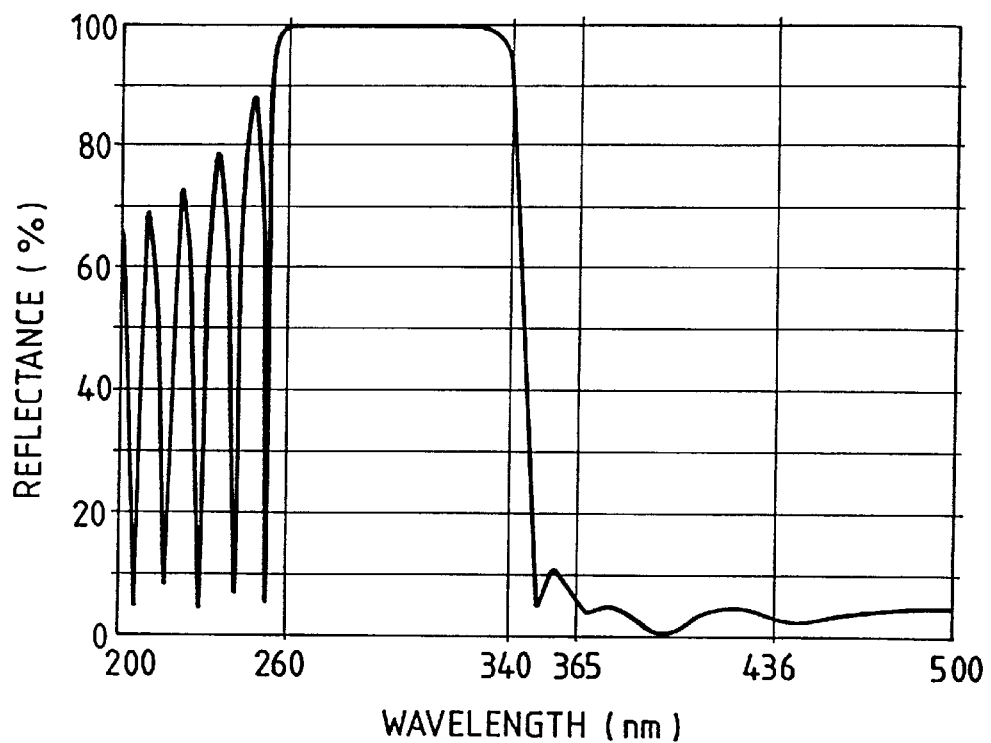
FIG. 9 is a chart showing an example of reflectance characteristics of the multilayered film used in the third embodiment.

FIG. 8 shows a cross section of such a multilayered film, wherein the film is formed according to the above design (5)

and the number of layers is 10. As the substrate, materials which transmit light having a wavelength of 350 nm or longer wavelengths can be used, including optical glass, quartz glass, fluorite, and the like. When the material employed as the substrate absorbs light having a wavelength of 340 nm or shorter wavelengths, such light can be prevented from being transmitted more effectively. By coating the glass of the mercury lamp with the multilayered film, blurring of the other optical members in the illuminating apparatus can be reduced.

Next, the fourth embodiment of the present invention will be described with reference to FIGS. 10 and 11. The components in FIG. 10 corresponding to those in FIG. 12 are indicated by the same reference numerals, and detailed description thereof is omitted. In this embodiment, an optical filter which absorbs light having a wavelength from 260 to 340 nm is provided in the optical path of the illuminating optical system.

Figure 10:
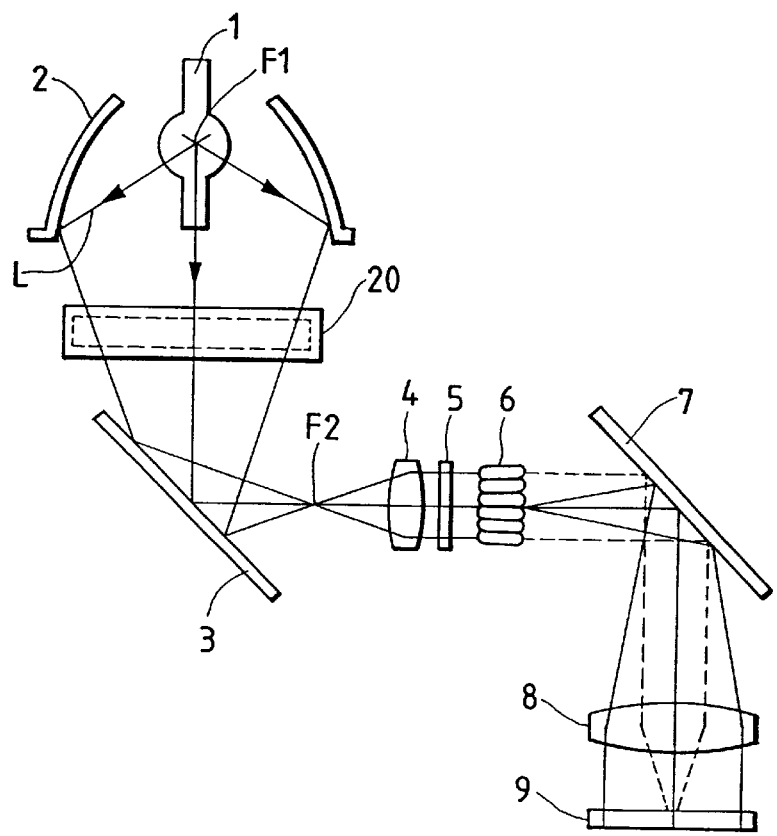
FIG. 10 is a schematic view showing the construction of a fourth embodiment of the illuminating apparatus according to the present invention.
Figure 11:
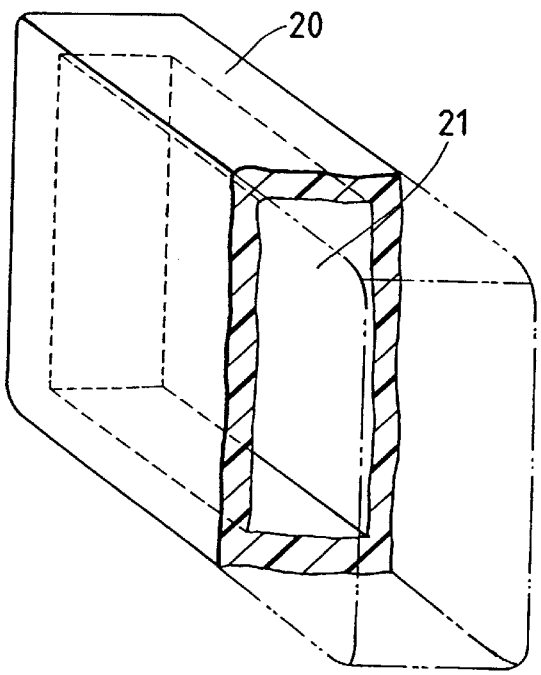
FIG. 11 is a perspective view showing the broken-out section of a box member 20 used in the fourth embodiment.

FIG. 10 schematically shows the construction of this embodiment. As shown in FIG. 10, a box member 20 is arranged between the ellipsoidal mirror 2 and the mirror 3. The box member has two flat glass surfaces parallel to each other. FIG. 11 shows a broken-out section of the box member. The box member 20 has a hollow space 21, which is arranged to coincide with the optical path. A gaseous substance which absorbs light having a wavelength from 260 to 340 nm (cf. description of the first embodiment) is contained in the hollow space 21. The box member is arranged preferably in the vicinity of the mercury lamp 1, as shown FIG. 10. The box member 20 reduces adhesion of the white powder on the optical members arranged downstream in the optical path from the box member 20.

The glass material of the box member 20 may be the glass material used in the second embodiment, that is, the glass material which absorbs certain undesirable light. Or the box member 20 may be replaced by a plane parallel glass which has absorption characteristics similar to those of the glass materials used in the second embodiment. In addition to the glass materials used in the second embodiment, the plane parallel glass provided in the illuminating optical system may be also made of a crystalline material (for example, fluorite $CaF_2$, magnesium fluoride, and so on) to which the above-mentioned metal (such as Na, Fe, and the like) is doped.

This fourth embodiment is useful in case, for example, the double-bulb structure employed in the first embodiment is difficult to manufacture.

The illuminating apparatus according to the present invention can be applied not only to the projection exposure apparatus as described but also to a proximity-type exposure apparatus and a contact-type exposure apparatus, and further any type of optical apparatus using ultraviolet rays.

As described before, ammonium sulfate is formed from trace sulfur dioxide ($SO_2$) and ammonia ($NH_3$) existing in the ambient atmosphere in which the illuminating apparatus is used. Accordingly, if the illuminating apparatus is installed in a clean room, sulfur dioxide ($SO_2$) and/or ammonia ($NH_3$) may be removed from the air circulated in the clean room by attaching a filtering system for removing sulfur dioxide ($SO_2$) and/or ammonia ($NH_3$) to the air conditioning system. Thus, formation of ammonium sulfate can be reduced.

The devices of the first to fourth embodiment can be used separately. But if used in combination, these devices can more effectively prevent adhesion of the white powder. Note that the present invention is not limited to the above-mentioned embodiments. The present invention includes any construction which concerns the fundamental principles of the present invention.

What is claimed is:

1. An illuminating apparatus which is used for an exposure apparatus, comprising:
    a pair of electrodes which generates light exposing a photosensitive agent which is coated on an object to be illuminated:
    a bulb which reduces an amount of said light at a wavelength in a range of 260 to 340 nm so that production of ammonium sulfate is restricted; and
    an optical system for condensing the light emitted from said bulb and directing the condensed light to illuminate said object.

2. An illuminating apparatus according to claim 1, wherein said bulb is made with glass to doped with metal.

3. An illuminating apparatus according to claim 2, wherein said metal is at least one of Na, Fe, Pb, Al, Rb and Cs.

4. An illuminating apparatus according to claim 1, wherein said bulb has a hollow space containing fluid that absorbs light having said wavelength in said range.

5. An illuminating apparatus according to claim 4, wherein said fluid is one of gaseous rubidium, gaseous cesium and ozone gas.

6. An illuminating apparatus according to claim 1, wherein said bulb is coated with a film which absorbs or reflects light having said wavelength in said range.

7. An illuminating apparatus according to claim 6, wherein said film is a multilayered film composed of a layer which is one of $ZrO_3$, $Sc_2O_3$, $HfO_2$ and $Y_2O_3$, and a layer which is one of $SrO_2$ and $MgF_2$.

8. An illuminating apparatus according to claim 1, wherein said object is a photosensitive substrate, said optical system condenses the light emitted from said bulb onto a mask on which a pattern is formed, and the illuminating apparatus is provided in an apparatus for transferring the pattern on the mask onto the photosensitive substrate.

9. An illuminating apparatus according to claim 1, wherein said bulb has a hollow space through which fluid, which absorbs light having said wavelength in said range, flows.

10. An illuminating apparatus according to claim 1, wherein said bulb shields substantially all light in said range and transmits substantially all light having a wavelength above 350 nm.

11. An illuminating apparatus comprising:
    a lamp having a pair of electrodes and a bulb; and
    an optical system located between the lamp and a mask, which illuminates the mask with light from the lamp to expose a substrate with a pattern of the illuminated mask,
    wherein said bulb reduces an amount of light generated by said pair of electrodes having a wavelength that would contribute to production of ammonium sulfate.

12. An illuminating apparatus according to claim 11, wherein said bulb comprises a hollow space containing a fluid that absorbs light having a wavelength that would contribute to production of ammonium sulfate.

13. An illuminating apparatus according to claim 11, wherein said bulb comprises a hollow space through which fluid, which absorbs light having a wavelength that would contribute to production of ammonium sulfate, flows.

14. An exposure apparatus comprising:
    a lamp having a pair of electrodes and a bulb; and
    an optical system located between the lamp and a mask, which illuminates the mask with light from the lamp to expose a substrate with a pattern of the illuminated mask, wherein said bulb reduces an amount of light generated by said pair of electrodes having a wavelength that would contribute to production of ammonium sulfate.

15. An illuminating apparatus applicable to a system for manufacturing a micro device, comprising:
   a lamp including a pair of electrodes and a bulb which reduces an amount of light having a wavelength in a range of 260 to 340 nm to restrict production of ammonium sulfate; and
   an optical system for converging the light from said lamp in the manufacture of said micro device.

16. A method of making an illuminating apparatus which is used for an exposure apparatus, said method comprising:
   providing a pair of electrodes which generates light exposing a photosensitive agent which is coated on an object to be illuminated;
   providing a bulb which reduces an amount of light having a wavelength in a range of 260 to 340 nm so that production of ammonium sulfate is restricted; and
   providing an optical system for condensing the light emitted from the bulb and directing the condensed light to illuminate said object.

17. An illuminating apparatus which is used for an exposure apparatus, comprising:
   a pair of electrodes which generates light exposing a photosensitive agent which is coated on an object to be illuminated;
   a lamp having a bulb which reduces an amount of said light in a wavelength range which would contribute to production of a substance that tends to cloud the lamp; and
   an optical system for converging light from said lamp to illuminate said object.

18. An illuminating apparatus according to claim 17, wherein said substance that tends to cloud the lamp is ammonium sulfate.

19. An illuminating apparatus according to claim 18, wherein said wavelength range is 260 to 340 nm.

20. An illuminating apparatus according to claim 17, wherein said bulb is made with glass doped with metal.

21. An illuminating apparatus according to claim 20, wherein said metal is at least one of Na, Fe, Pb, Al, Rb and Cs.

22. An illuminating apparatus according to claim 17, wherein said bulb has a hollow space containing fluid that absorbs light having a wavelength in said range.

23. An illuminating apparatus according to claim 22, wherein said fluid is one of gaseous rubidium, gaseous cesium and ozone gas.

24. An illuminating apparatus according to claim 17, wherein said bulb is coated with a film which absorbs or reflects light having a wavelength in said range.

25. An illuminating apparatus according to claim 24, wherein said film is a multilayered film composed of a layer which is one of $ZrO_3$, $Sc_2O_3$, $HfO_2$ and $Y_2O_3$, and a layer which is one of $SrO_2$ and $MgF_2$.

26. An illuminating apparatus according to claim 17, wherein said object is a photosensitive substrate, said optical system condenses the light emitted from said bulb onto a mask on which a pattern is formed, and the illuminating apparatus is provided in an apparatus for transferring the pattern on the mask onto the photosensitive substrate.

27. An apparatus according to claim 17, wherein said bulb has a hollow space through which fluid, which absorbs light having a wavelength in said range, flows.

28. An apparatus according to claim 17, wherein said bulb shields substantially all light in said range and transmits substantially all light having a wavelength above 350 nm.

* * * * *